(12) United States Patent
Zhang et al.

(10) Patent No.: US 8,952,605 B2
(45) Date of Patent: Feb. 10, 2015

(54) METAL HEXABORIDE COLD FIELD EMITTER, METHOD OF FABRICATING SAME, AND ELECTRON GUN

(71) Applicant: National Institute for Materials Science, Ibaraki (JP)

(72) Inventors: Han Zhang, Ibaraki (CN); Jie Tang, Ibaraki (CN); Luchang Qin, Ibaraki (CN); Jinshi Yuan, Ibaraki (CN); Norio Shinya, Ibaraki (JP); Yasushi Yamauchi, Ibaraki (JP)

(73) Assignee: National Institute for Materials Science, Ibaraki (JP)

( * ) Notice: Subject to any disclaimer, the term of this patent is extended or adjusted under 35 U.S.C. 154(b) by 0 days.

(21) Appl. No.: 14/370,082

(22) PCT Filed: Jun. 26, 2013

(86) PCT No.: PCT/JP2013/067491
§ 371 (c)(1),
(2) Date: Jul. 1, 2014

(87) PCT Pub. No.: WO2014/007121
PCT Pub. Date: Jan. 9, 2014

(65) Prior Publication Data
US 2015/0002009 A1    Jan. 1, 2015

(30) Foreign Application Priority Data

Jul. 3, 2012 (JP) ................................. 2012-149031

(51) Int. Cl.
*H01J 29/46*    (2006.01)
*H01J 1/304*    (2006.01)
(Continued)

(52) U.S. Cl.
CPC ............... *H01J 1/304* (2013.01); *H01J 37/073* (2013.01); *H01J 37/285* (2013.01)
USPC .......... 313/458; 313/414; 423/252; 250/492.3

(58) Field of Classification Search
USPC .......... 313/458, 441, 446; 423/252, 289, 263, 423/297; 250/492.3, 493.1
See application file for complete search history.

(56) References Cited

U.S. PATENT DOCUMENTS 3,833,494 A * 9/1974 Van Stratum et al. ........ 204/484
4,482,838 A   11/1984 Ishii et al.
(Continued)

FOREIGN PATENT DOCUMENTS

WO    2010/123007    10/2010

OTHER PUBLICATIONS

International Search Report issued Jul. 30, 2013 in International (PCT) Application No. PCT/JP2013/067491.
(Continued)

*Primary Examiner* — Anne Hines
(74) *Attorney, Agent, or Firm* — Wenderoth, Lind & Ponack, LLP.

(57) ABSTRACT

A metal hexaboride nanowire such as $LaB_6$ with the formed metal-terminated (100) plane at the tip has a small work function, and can emit a very narrow electron beam from the (100) plane. In such emitters, contamination occurs in a very short time period, and the output current greatly decreases when used under low temperature. The cold field emitter of the present invention overcomes this problem with a stabilization process that exposes the metal-terminated (100) plane of the tip to hydrogen at low temperature, and can stably operate over extended time periods.

7 Claims, 6 Drawing Sheets

(51) Int. Cl.
*H01J 37/073* (2006.01)
*H01J 37/285* (2006.01)

(56) References Cited

U.S. PATENT DOCUMENTS

| | | | |
|---|---|---|---|
| 4,486,684 A | 12/1984 | Hohn | |
| 2010/0028235 A1* | 2/2010 | Qin et al. | 423/263 |
| 2010/0032587 A1* | 2/2010 | Hosch et al. | 250/492.3 |
| 2012/0177556 A1* | 7/2012 | Graeve et al. | 423/252 |

OTHER PUBLICATIONS

M. Gesley et al., "A Determination of the Low Work Function Planes of $LaB_6$", Surface Science, vol. 146, pp. 583-599, 1984.

K. Murakami et al., "An Atom-Probe Analysis of $LaB_6$ (001) Plane", Surface Science, vol. 124, pp. L25-L30, 1983.

* cited by examiner

METAL HEXABORIDE COLD FIELD EMITTER, METHOD OF FABRICATING SAME, AND ELECTRON GUN

TECHNICAL FIELD

The present invention relates to cold field emitters (CFE) used in applications such as the electron source of an electron microscope, particularly to a metal hexaboride CFE of improved stability, a method for fabricating same, and an electron gun using same.

BACKGROUND ART

Electron microscopes including transmission electron microscopes (TEM) and scanning electron microscopes (SEM) have acquired ever increasing resolutions in terms of space, time, and energy as a basic tool for studies in a wide range of fields from material science to biology. Improved resolutions require a brighter point electron source for an electron microscope, and a stable emission electron beam with high time coherence needs to be generated. CFE has the highest brightness and time coherence compared to other electron sources such as Schottky emitters and thermionic emitters.

In CFE, the brightness of the electron source is related to emission current density. This can be represented by the simplified Fowler-Nordheim equation of the form $$J=c_1F^2/\phi\exp(-c_2\phi^{3/2}/F) \quad (1),$$

where the variables F and $\phi$ are the local electric field strength, and the work function of the emitter material, respectively. The symbols $c_1$ and $c_2$ can be treated as constants under the actual operating conditions. The time coherence of CFE can be characterized as the spread of emitter energy, as can be represented by the following equation.

$$\Delta E=c_3F/\phi^{1/2} \quad (2),$$

where $c_3$ is a constant. It follows from this that emission current density J can be regarded as a function of the two independent variables $\phi$ and $\Delta E$, as represented by the following formula (3) obtained by combining the equations (1) and (2)

$$J=c_4\Delta E^2\exp(-c_5f/\Delta E) \quad (3),$$

where $c_4$ and $c_5$ are complex constants of constant parts that occur in the process of deriving the equation. It follows from equation (3) that smaller work functions produce higher emission current densities and smaller energy spreads at the same time.

Tungsten (W), a conventional CFE material, has a work function in excess of 4.5 eV, though it varies with the crystal plane. $LaB_6$, having a (100) plane work function of 2.6 eV, represents a more desirable emitter material. $LaB_6$ can produce very high brightness, and has been used as an alternative material of the W thermionic emitter. This is due to the fact that in addition to the small work function, $LaB_6$ has other advantages such as high conductivity, high mechanical strength, and high melting point. The thermionic emitter operates at temperatures above 1500° C. Here, all the residual gas in a vacuum is the result of desorption from the emitter surface, and the $LaB_6$ surface remains clean. Another advantage of the high-temperature heating is that the $LaB_6$ end surface is La-terminated. This is important because the work function is small only when the $LaB_6$ surface is La-terminated. The B-terminated $LaB_6$ surface, on the other hand, has a large work function. However, the clean La-terminated $LaB_6$ surface is rapidly contaminated when the $LaB_6$ is operated at temperatures below 900° C., or in a cold field emission mode that involves temperatures below room temperature. In this case, the emission current decreases as much as 90% in 5 minutes, when the practical electron source for electron microscopes requires at least several hours of operation time.

Another problem of the $LaB_6$ emitter operating at low temperature is that the emitter has a B-terminated surface. This is problematic because the characteristic advantage of $LaB_6$, specifically the small work function of the La-terminated surface cannot be exploited when the $LaB_6$ emitter based on the related art is used in the cold field emission mode.

This is specifically as follows. The work function of $LaB_6$ is determined by the terminal surface atoms, specifically the atoms appearing on the crystal surface. The work function is greater for the B-terminated surface, and smaller for the La-terminated surface. The (100) crystal plane of a $LaB_6$ nanowire produced in the related art is terminated on the B atoms, for example, as described in Non-Patent Literature 2, and the (100) plane of such a $LaB_6$ nanowire has a large work function. When used as an emitter, such a $LaB_6$ nanowire emits electrons from the (110)/(210) plane having a relatively small work function. Because the $LaB_6$ nanowire extends in a <100> direction, electrons are not released from the B-terminated (100) plane of a large work function, but are emitted from the surrounding (110)/(210) plane. The emission pattern thus has a dark central portion, with bright spots distributed in the peripheral portions (see FIG. 5(b)). A nanowire that extends in a (210) direction produces an emission pattern appearing bright in the central portion; however, the surrounding (110) region, and other (210) region also appear bright. In an ideal point electron source, emission must occur only from one location at the central portion of the emission pattern. The best form of a cold electron source, then, is when a $LaB_6$ nanowire has a La-terminated (100) plane at the tip. These are described in, for example, Patent Literatures 1 and 2, and Non-Patent Literatures 1 and 2. Readers are requested to refer to these documents, as necessary.

SUMMARY OF INVENTION

Technical Problem

It is an object of the present invention to provide a low-temperature process whereby the (100) emitter surface of the La or other metallic atom terminal formed at the tip of a metal hexaboride nanowire of metal hexaborides such as $LaB_6$ and other rare earths, and alkali earths such as Ca can be stabilized for extended time periods. It is another object of the present invention to provide a CFE that uses a metal hexaboride nanowire that can stably operate for extended time periods even under low temperature. The present invention also provides an electron gun that uses such a CFE.

Solution to Problem

According to an aspect of the present invention, there is provided a metal hexaboride cold field emitter comprising a metal hexaboride nanorod ending at a tip having a hydrogen-stabilized metal-terminated (100) plane.

The nanorod may be a monocrystal that extends in a <100> direction.

The tip may be shaped into a hemispherical form.

The nanorod may have a diameter in a range of 10 to 300 nm.

The metal hexaboride may be LaB$_6$. According to another aspect of the present invention, there is provided a method for fabricating a metal hexaboride cold field emitter, the method comprising stabilizing a metal-terminated (100) plane formed at the tip of a metal hexaboride nanorod by exposing the metal-terminated (100) plane to hydrogen.

The hydrogen exposure may be performed at 150 K or less.

The metal-terminated (100) plane may be formed by applying positive voltage to a B-terminated (100) plane formed at the tip of the nanorod.

The metal-terminated (100) plane may be formed by subjecting the B-terminated (100) plane formed at the tip of the nanorod to a field evaporation process in the presence of Ne.

The nanorod may be a metal hexaboride monocrystal that extends in a <100> direction.

The tip of the nanorod may be shaped into a hemispherical form to form the B-terminated (100) plane at a central portion of the tip.

The hemispherical shape may be formed by subjecting the tip of the nanorod to a field evaporation process.

The field evaporation process for forming the hemispherical shape may be performed in the presence of hydrogen.

According to yet another aspect of the present invention, there is provided an electron gun that comprises any of the foregoing metal hexaboride cold field emitters.

The electron gun may include: a cooling device connected to the metal hexaboride cold field emitter via an electrically insulating heat conductor; and a hydrogen nozzle through which hydrogen is introduced.

Advantageous Effects of Invention

The metal hexaboride emitter of the present invention having a metal terminated surface stabilized by a hydrogen process can stably produce a large emission current for extended time periods even under low temperature. The emitter of the present invention releases electrons from the (100) plane at the center of the emitter tip, and emission hardly occurs from the surrounding areas. The present invention thus provides an ideal point electron source.

DESCRIPTION OF EMBODIMENTS

The present invention is described below using an embodiment. The embodiment is intended to help assist the understanding of the present invention, and in no way limits the present invention. It is to be understood that the technical scope of the present invention is to be determined solely by the appended claims. As an example, the present invention is not limited to the LaB$_6$ emitter described in detail in the description of the present application, and is also applicable to other metal hexaborides such as CeB$_6$, GdB$_6$, YB$_6$, CaB$_6$, BaB$_6$, and SrB$_6$. The methods described in the following description deal with not only production of a new emitter, but regeneration of a disabled or seriously impaired emitter that can no longer function as the emitter of the present invention because of contamination or the like occurring during use. It should be understood that such a method of regenerating the function of the impaired emitter also represents the emitter fabrication method. The claims disclosed herein must be construed in their widest meaning.

Embodiment

Figure 1:
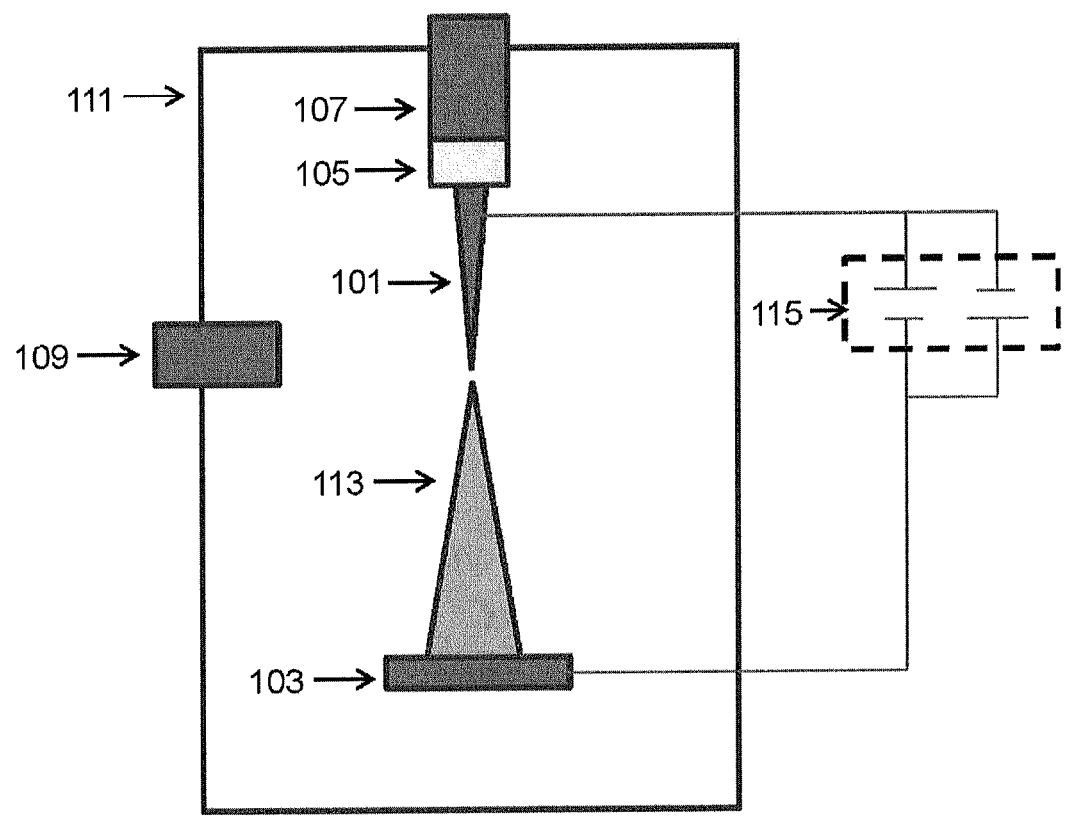
FIG. 1 is a conceptual diagram showing the structure of an apparatus for preparing a LaB$_6$ emitter.

FIG. 1 is a conceptual diagram showing the configuration of an apparatus for preparing a LaB$_6$ emitter of an embodiment of the present invention (hereinafter, the apparatus will also be called "emitter test system"). The LaB$_6$ emitter prepared by using the apparatus may be installed in an electron gun of the configuration conceptionally shown in FIG. 2 to provide a LaB$_6$ electron gun for use in applications such as an electron microscope. FIG. 3 is a flowchart of the procedures of preparing a LaB$_6$ emitter with the apparatus of FIG. 1, and producing and using the LaB$_6$ electron gun shown in FIG. 2.

Figure 4:
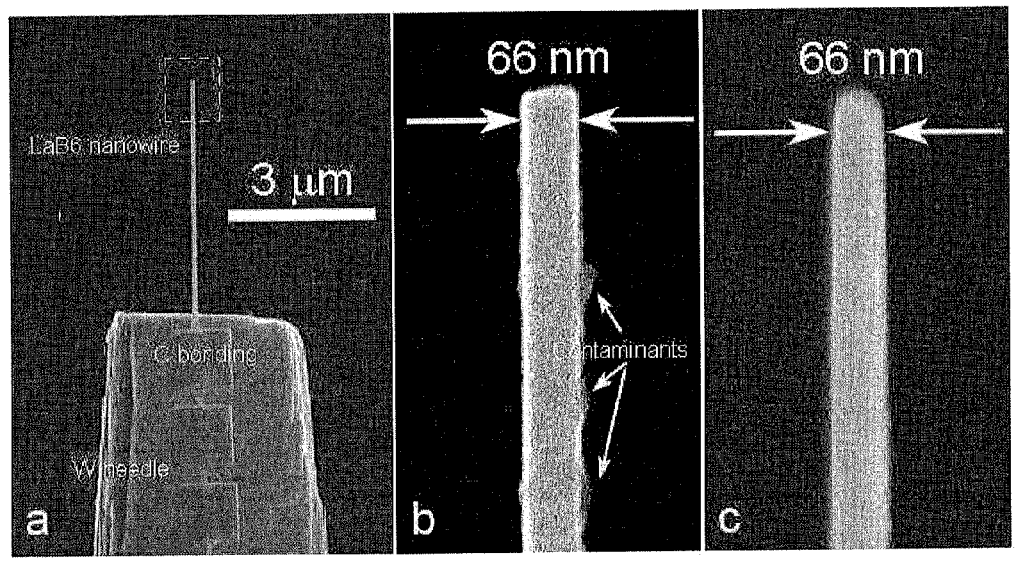
FIG. 4 is a SEM image of the LaB$_6$ emitter.

In the emitter test system shown in FIG. 1, a LaB$_6$ emitter 101 is installed in a chamber 111, and processed for use in an electron gun. The LaB$_6$ emitter 101 uses a LaB$_6$ monocrystalline nanowire. The nanowire has very small dimensions with a diameter of about several ten nanometers, and a length of about several ten micrometers, and is difficult to handle. Given such a small size of the nanowire, the LaB$_6$ nanowire in actual practice may be used as a LaB$_6$ emitter by being attached to the tip of a base such as a metallic needle. FIG. 4(a) shows an example of a SEM image of a LaB$_6$ emitter having such a structure. In FIG. 4(a), the LaB$_6$ nanowire is bonded to portions on the side of the tungsten (W) needle tip by carbon (C) bonding. In the specific LaB$_6$ emitter shown in the figure, the LaB$_6$ nanowire projects out of the W needle tip by a length of 5 µm, and the nanowire has a diameter of 66 nm. However, the projection length and the diameter of the nanowire are not limited to these, and the nanowire may have a projection length of, for example, 0.2 to 20 µm, and a diameter of, for example, 10 to 300 nm. The method used to fabricate the LaB$_6$ nanowire, various characteristics of the nanowire, and the bonding of the nanowire to the tip portion of a base such as a metallic needle per se are well known to skilled artisan, and will not be described in detail. Reference should be made to, for example, Patent Literature 3, Non-Patent Literature 3, and documents cited in these publications, as necessary.

Referring back to FIG. 1, the LaB$_6$ emitter 101 is attached to a cold head 107 via an electrical insulator/heat conductor 105, which is an electrically insulating member with high thermal conductivity characteristics. The electrical insulator/heat conductor 105 is not limited to this, and may be, for example, a ceramic discotic member based on barium oxide. The desirable electrical insulation and heat conductivity are needed because the efficient release of electrons from the LaB$_6$ emitter 101 requires processes, such as purification, that involve applying high voltage while cooling the emitter to a temperature far below room temperature, as will be described later. A bipolar power supply 115 is provided for the high-voltage application purpose, and is connected to the LaB$_6$ emitter 101.

Referring to step 301 of FIG. 3 (all steps are shown in FIG. 3, and will be referred to simply by step numbers), the LaB$_6$ nanowire used is <001> oriented. Accordingly, the tip does not necessarily have a flat surface perpendicular to this direction, as clearly shown in the SEM image of FIG. 4(b), and the (100) plane is not always present in this part of the nanowire. Further, as shown in the figure, contaminants are adhering to the wire. The LaB$_6$ nanowire as fabricated is therefore insufficient when it is to be used as the emitter in this state. The nanowire is thus subjected to a field evaporation process. Specifically, the LaB$_6$ emitter 101 is cooled to 80 K or less with a cold head 107 via the electrical insulator/heat conductor 105 (step 303). Thereafter, hydrogen gas is introduced through a hydrogen nozzle 109, and high voltage is applied to the LaB$_6$ emitter 101 as a H$_2$ field evaporation process. The field evaporation is typically performed in a high vacuum. In the present embodiment, however, the field evaporation was performed as a H$_2$ field evaporation process, specifically in an atmosphere containing trace amounts of H$_2$ (about 1×10$^{-6}$ torr). The field evaporation performed in the presence of H$_2$ requires a smaller electric field strength (typically 60%) than the electric field strength required in field evaporation performed without adding H$_2$. FIG. 4(c) shows a SEM image at the same location as that of the unprocessed LaB$_6$ nanowire shown in FIG. 4(b) after the H$_2$ field evaporation process. By comparing these two SEM images, it is clear that the H$_2$ field evaporation process evaporates large numbers of atoms particularly from the tip portion of the LaB$_6$ nanowire where the electric field concentrates, and shapes the tip portion into a hemispherical form. The process also removes the contaminants adhering to the nanowire.

Figure 5:
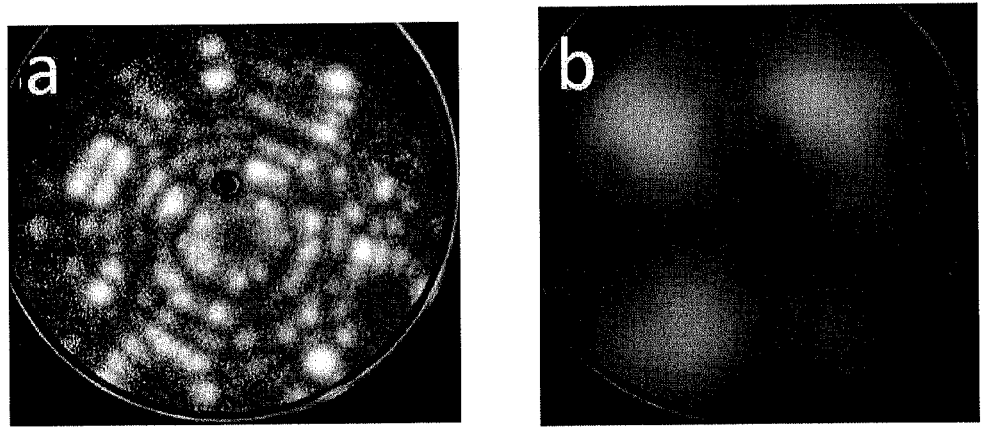
FIG. 5(a) is a field ion microscope (FIM) image of a B-terminated LaB$_6$ (100) plane after H$_2$ assisted field evaporation.
FIG. 5(b) is a field emission microscope (FEM) image showing that the LaB$_6$ (100) plane has a greater work function as compared to the surrounding crystal planes.

FIG. 5(a) shows a H$_2$ FIM image of the tip of the LaB$_6$ emitter 101 after the sufficient H$_2$ field evaporation process (the state shown in FIG. 4(c)). The LaB$_6$ (100) plane appearing at the center is a B-terminated plane. FIG. 5(b) shows a FEM image of the same portion. As described above, the B-terminated (100) plane has a larger work function. As can be seen in FIG. 5(b), the result that the field emission from the B-terminated (100) plane at the center of the observed LaB$_6$ emitter 101 is weaker than the field emissions from the surrounding planes of other orientations confirms that the (100) plane is B-terminated.

As is known, a FIM image is obtained by applying high positive voltage to a needle-like sample in an atmosphere of trace amounts of imaging gas, and the ion flow from the sample tip surface is converted into a visible image with an electron/ion imaging device 103. A FEM image is obtained by applying high negative voltage to a needle-like sample in a high vacuum state, and the emitted electron beam from the tip is converted into a visible image with the electron/ion imaging device 103. The progression of field evaporation is observed from these images, and an appropriate field evaporation applied voltage (shaping voltage), and an appropriate application time are determined. More specifically, by directly observing the progression of the field evaporation process from FIM, formation of the hemispherical shape at the tip is confirmed from the observed FIM image, and the H$_2$ field evaporation process is finished. The shaping voltage V$_s$ used is then recorded after the completion of the field evaporation (step 305).

In the next step 307, a voltage in excess of the shaping voltage is applied for a predetermined time period not in a H$_2$ atmosphere but in a Ne atmosphere to perform a Ne field evaporation process, and form a La-terminated (100) plane at the LaB$_6$ emitter tip. As in step 305, the field evaporation process is performed while observing the FIM image, and the end point of the field evaporation process is determined from the observed FIM image. The FEM image of the LaB$_6$ emitter tip is then observed to confirm that strong electron emission occurs only from the centrally located (100) plane (details will be described later). The voltage used to form this plane is recorded as polarization voltage V$_p$.

Figure 6:
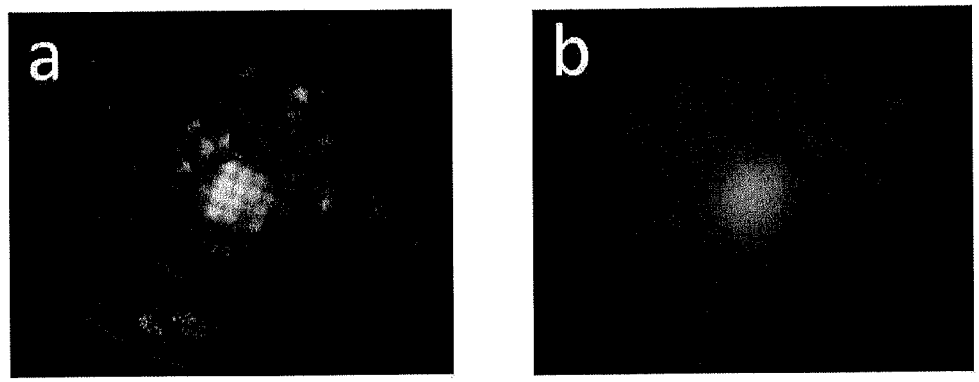
FIG. 6(a) is a FIM image showing a La-terminated LaB$_6$ (100) plane after field evaporation in Ne (Ne is used as imaging gas)
FIG. 6(b) is a FEM image showing that the LaB$_6$ (100) plane has a smaller work function as compared to the surrounding crystal planes.

FIGS. 6(a) and 6(b) show FIM and FEM images, respectively, obtained from the LaB$_6$ emitter tip subjected to the field evaporation in step 307 using Ne instead of H$_2$. The FIM image shown in FIG. 6(a) was obtained by using Ne as the imaging gas. After the field evaporation process, a La-terminated (100) plane occurs at the tip of the LaB$_6$ emitter. In the FEM image shown in FIG. 6(b), only a single bright image is observed at the central portion, indicating that the (100) plane at the center is a La-terminated (100) plane having a smaller work function than the surrounding planes of other orientations. In this manner, the Ne field process is finished upon confirming the FIM image appearing as shown in FIG. 6(a), and the FEM image is observed to confirm that a bright image is appearing only in the narrow region at the central portion of the emitter tip. This makes it possible to confirm that the (100) plane at the tip portion is a La-terminated plane with a small work function.

The (100) plane is B-terminated when the field evaporation is performed with H$_2$ as above. Nonetheless, it is preferable to use H$_2$ field evaporation for the purpose of shaping the LaB$_6$ emitter 101 (nanowire) tip into a hemispherical form, because the H$_2$ field evaporation proceeds with a smaller electric field than the Ne field evaporation. This is also because the nanowire tends to be damaged during the process when Ne field evaporation is used throughout the processes of shaping the tip and forming the La-terminated plane. In the present embodiment, the H$_2$ field evaporation is used for shaping the nanowire tip, and the Ne field evaporation is performed in the step of making a La-terminated (100) plane at the tip of the shaped nanowire. In this way, the total required time for the all steps can be reduced, and the poor yield due to the damaged nanowire can be prevented. In the present embodiment, the La-terminated (100) plane is formed at the LaB$_6$ emitter tip by the Ne field evaporation. However, use of Ne is not necessarily required for this purpose. The essence of this process is to apply a large electric field to the emitter tip, and as such any other method may be used, as long as it can apply the electric field necessary to create the La-terminated plane.

Figure 2:
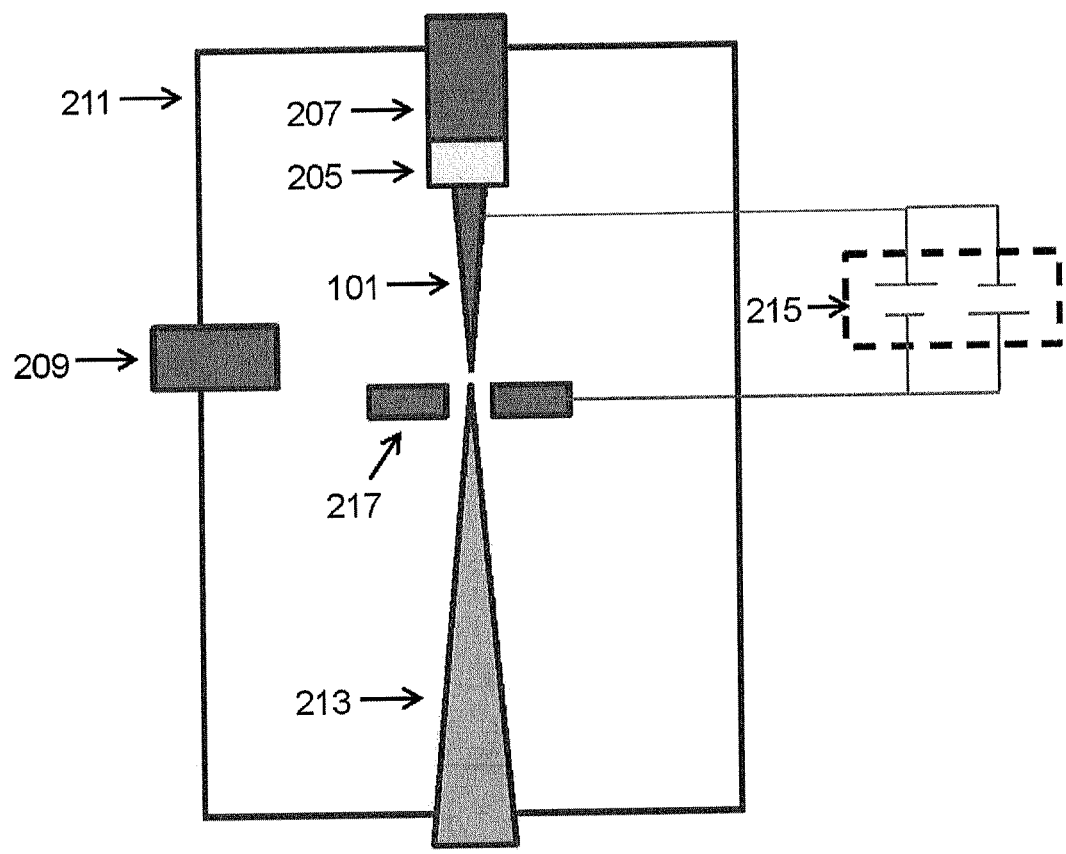
FIG. 2 is a conceptual diagram showing the structure of an electron gun that uses the LaB$_6$ emitter.
Figure 3:
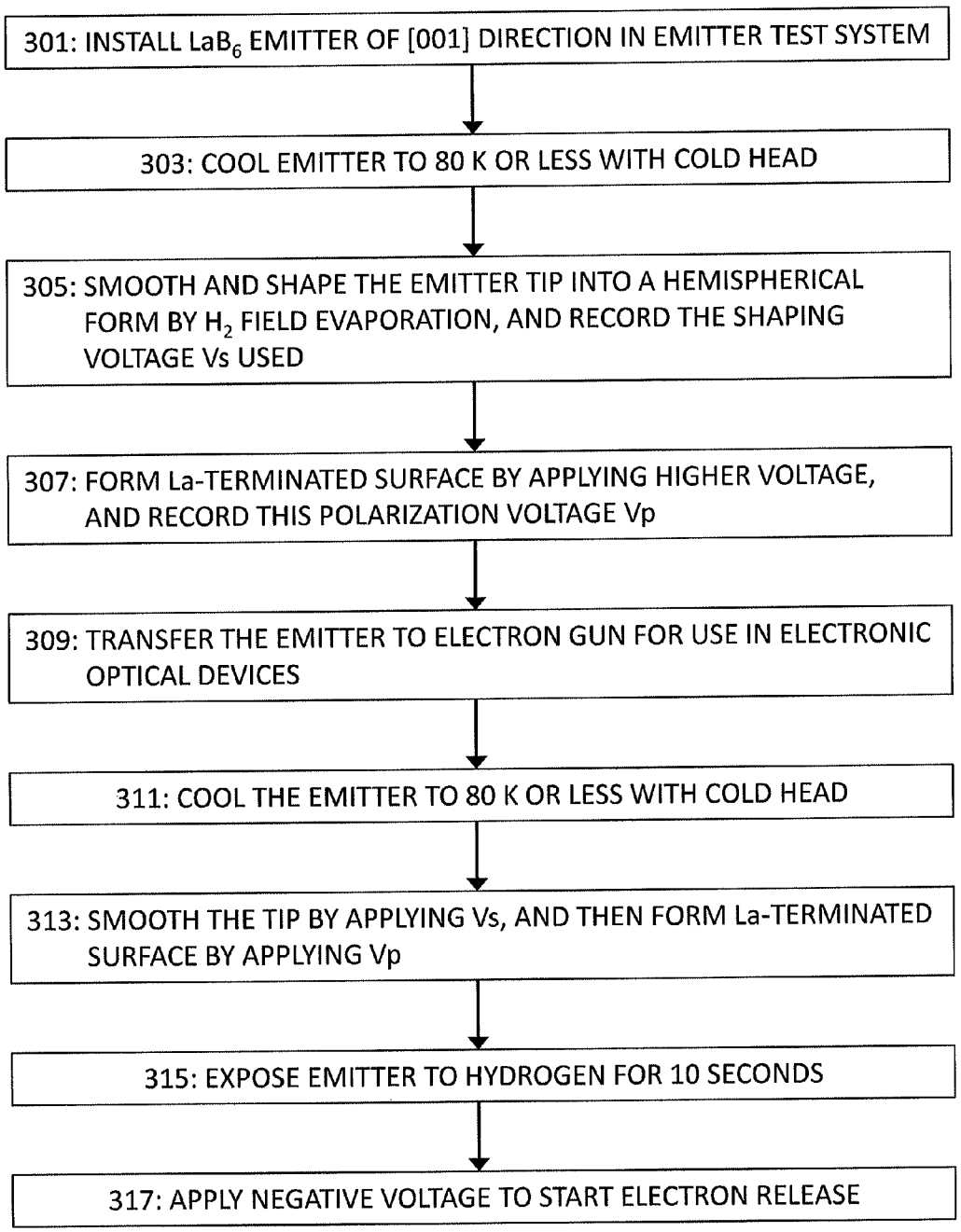
FIG. 3 is a flowchart of the procedures for preparing the LaB$_6$ emitter, and using the LaB$_6$ emitter in the electron gun.

After these steps, the LaB$_6$ emitter 101 is removed from the test system of FIG. 1, and installed in the electron gun shown in FIG. 2 (step 309). As in the case of FIG. 1, the LaB$_6$ emitter 101 is attached to a cold head 207 via an electrical insulator/heat conductor 205 in the electron gun. The LaB$_6$ emitter 101 in this configuration is cooled to 80 K or less (step 311).

Figure 7:
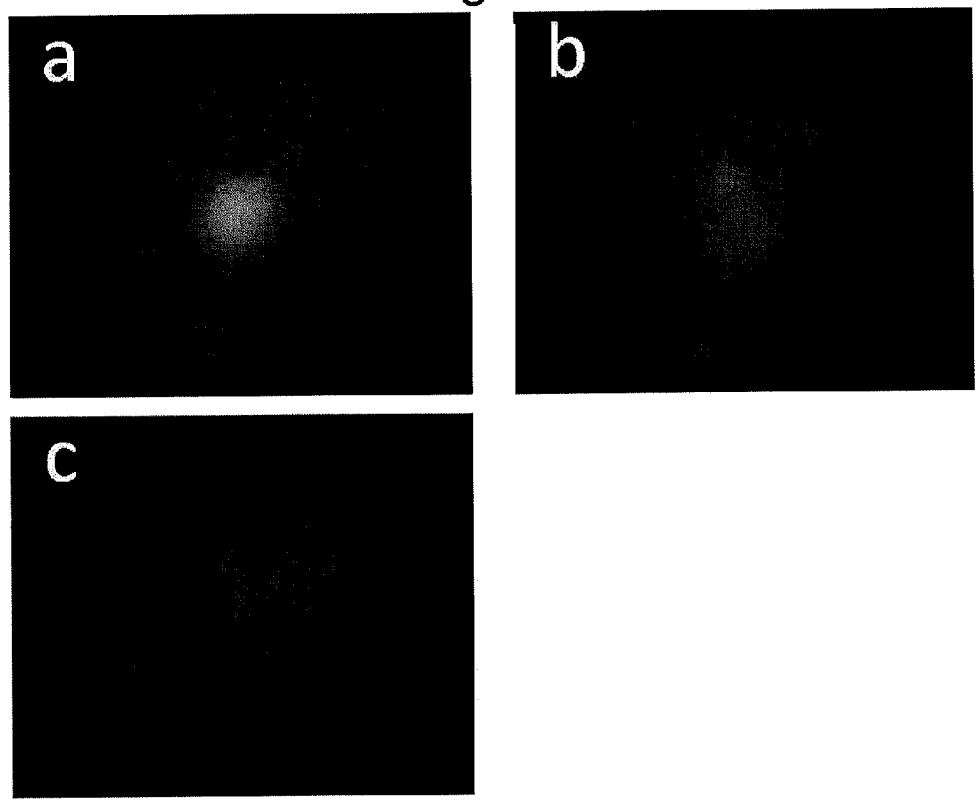
FIG. 7 shows time-dependent changes in the FEM image of the LaB$_6$ emitter not subjected to a hydrogen stabilization process, in which (a), (b), and (c) show FEM images after 0, 4, and 20 minutes, respectively, from the start of the field emission.

With the $LaB_6$ emitter 101 cooled to the predetermined temperature, the shaping voltage $V_s$ recorded as above is applied to shape the tip, and the recorded polarization voltage $V_p$ is applied to form the La-terminated (100) plane at the tip (step 313). The $LaB_6$ emitter 101 in this state has a tip with a La-terminated (100) plane, and the work function is small. A large-current electron beam 213 can thus be obtained from the field emission from the tip of the $LaB_6$ emitter 101 under the applied electric field to an extraction electrode 217. However, when left in this state, the field emission brightness rapidly decreases as shown in FIG. 7. The field emission from the tip of the $LaB_6$ emitter 101 is bright soon after the start of the field emission, as observed in FIG. 7(*a*). However, the brightness greatly decreases after 4 minutes (FIG. 7(*b*)), and hardly any field emission is observed after 20 minutes (FIG. 7(*c*)). The field emission shown in FIG. 7 was obtained under the applied voltage of −400 V at 100 K.

Figure 8:
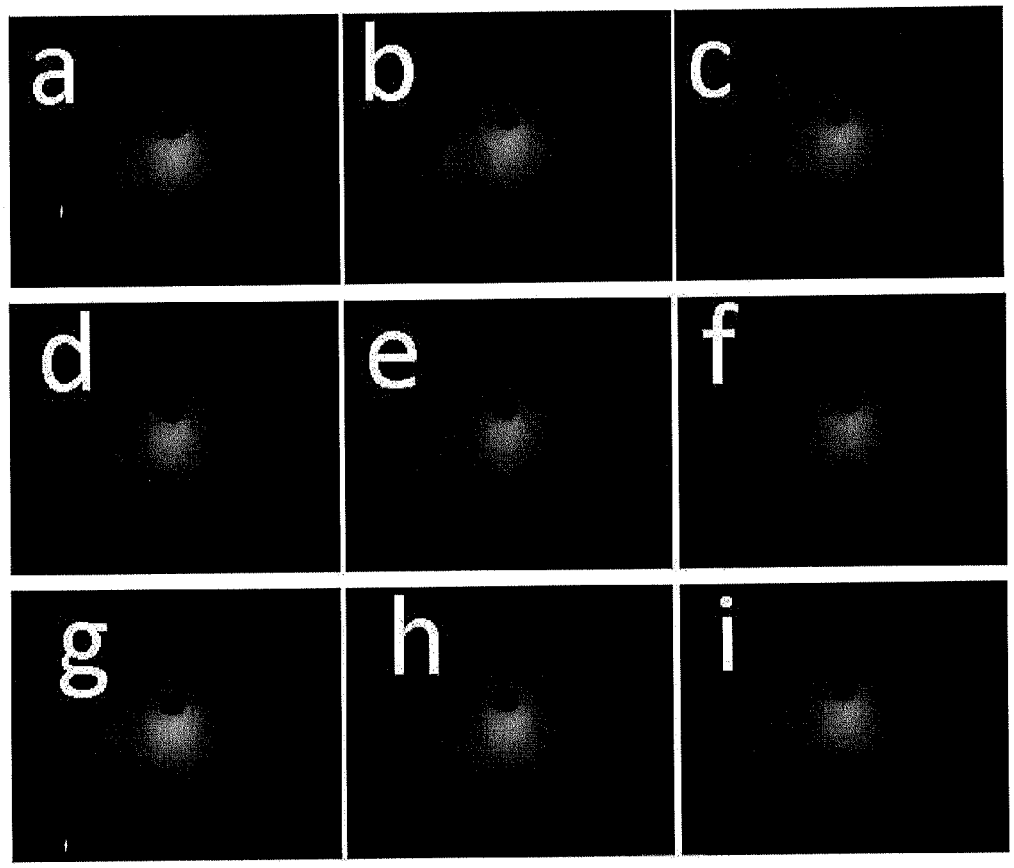
FIG. 8 shows time-dependent changes in the FEM image of the LaB$_6$ emitter subjected to a hydrogen stabilization process, in which (a) to (i) show FEM images after 0, 15, 30, 45, 60, 75, 90, 105, and 120 minutes, respectively, from the start of the field emission.
Figure 9:
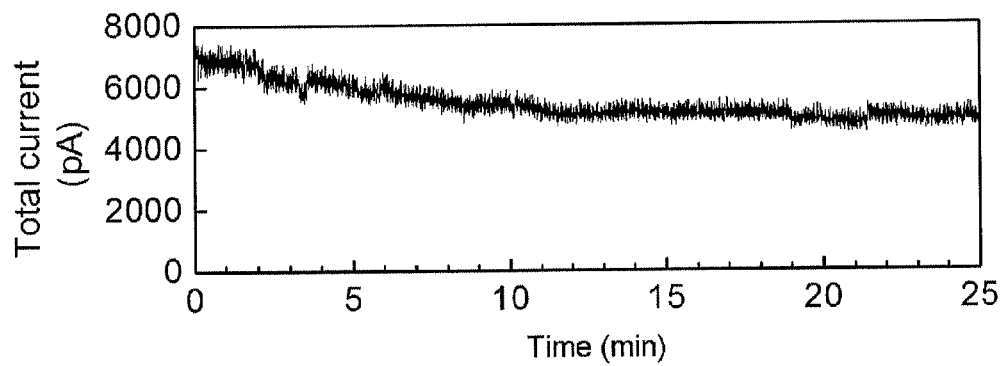
FIG. 9 is a graph representing time-dependent changes in the result of a measurement recording the total current of the field emission from the LaB$_6$ emitter over a time course of 25 minutes from the start of emission when the hydrogen stabilization process is performed.

In order to prevent such rapid deterioration of the $LaB_6$ emitter 101, and stably maintain the high field emission brightness for extended time periods, the $LaB_6$ emitter 101 is subjected to a stabilization process that uses hydrogen (step 315). Specifically, in the present embodiment, hydrogen gas was introduced through a hydrogen valve 209, and the $LaB_6$ emitter 101 was exposed to the hydrogen gas for 10 seconds. Field emission changes were then observed over time under the same voltage and temperature conditions as used in the experiment represented in FIG. 7. FIGS. 8(*a*) to 8(*i*) show the field emission brightness from the stabilized $LaB_6$ emitter after 0, 15, 30, 45, 60, 75, 90, 105, and 120 min from the start of the emission. Hardly any change was observed in the brightness at the start of the emission (FIG. 8(*a*)) and the brightness after 120 minutes (FIG. 8(*i*)). This result demonstrates that the $LaB_6$ emitter after the process of the present invention can stably operate for as long as it is required to operate under normal conditions in applications such as in an electron microscope while maintaining the intrinsic advantages as the $LaB_6$ emitter. The long, stable operation of the $LaB_6$ emitter of the present invention also can be confirmed from FIG. 9, which is a graph representing the result of a measurement recording the total current of the emitter field emission over a time course of 25 minutes from the start of emission. The $LaB_6$ emitter 101 after the stabilization process in step 315 can be put to actual use (step 317).

Table 1 summarizes various parameters of $LaB_6$ nanowires having tip diameters of 30, 45, 60, and 80 nm, specifically the appropriate shaping voltage Vs, the shaping time for shaping voltage Vs application, the subsequently applied polarization voltage, the polarization time for polarization voltage application, and the hydrogen exposure and the exposure temperature of the stabilization process. Table 1 also presents the preferred ranges of "shaping voltage", "shaping time", "polarization voltage", "polarization time", "hydrogen exposure", and "exposure temperature" for the tip diameter ranges given in parentheses in the cells under the heading "nanowire tip diameter". For the voltages, the change range in each cell is given as a percentage with respect to the center voltage. The other ranges are presented as numerical ranges in parentheses.

TABLE 1

| Experiment No. | Nanowire tip diameter (nm) | Shaping voltage $V_s$ (V) | Shaping time (h) | Polarization voltage $V_p$ (V) | Polarization time (min) | Hydrogen exposure (Langmuir) | Exposure temperature (K) |
|---|---|---|---|---|---|---|---|
| 1 | 30 (20-40) | 2100 ± 10% | 5 (>3) | 3200 ± 10% | 4 (2-8) | 500 (>5) | 77 (<150) |
| 2 | 45 (40-50) | 2900 ± 10% | 8 (>4) | 4200 ± 10% | 6 (3-9) | 200 (>5) | 77 (<150) |
| 3 | 60 (50-70) | 3100 ± 10% | 12 (>5) | 4500 ± 10% | 10 (5-15) | 10 (>5) | 77 (<150) |
| 4 | 80 (70-90) | 3900 ± 10% | 24 (>7) | 5600 ± 10% | 13 (7-18) | 10 (>5) | 77 (<150) |

Once the emitter is actually put to use, the emitter gradually deteriorates because of contamination or the like that occurs during use or storage. When this occurs, the processes of steps 313 and 315 may be performed to regenerate the emitter. In the procedures shown in FIG. 3, the shaping voltage and the polarization voltage, which are applied immediately before an attachment of the $LaB_6$ emitter 101 to the electron gun, are reapplied after the $LaB_6$ emitter 101 is attached to the electron gun. However, it is not necessarily required to repeat the application of these voltages prior to using the electron gun for the first time, when it is certain that the emitter surface has essentially no risk of being adversely affected by contamination or the like while the emitter is being transferred and attached to the electron gun. Further, it is not required to provide the apparatus of FIG. 1 and prepare the emitter therein when all the processes ending in step 307 can be performed in the state where the $LaB_6$ emitter is installed in the electron gun.

Industrial Applicability

As described above in detail, the present invention enables the metal boride emitter to be continuously used in a cold field emission mode for extended time periods with the maintained high brightness, and has a potential great contribution to further resolution improvement of electron microscopes.

REFERENCE SIGNS LIST

101: $LaB_6$ emitter
103: Electron/ion imaging device
105, 205: Electrical insulator/heat conductor
107,207: Cold head
109,209: Hydrogen nozzle
111,211: Chamber
113,213: Electron beam
115,215: Bipolar power supply
217: Extraction electrode
Citation List
Patent Literature
    PTL 1: U.S. Pat. No. 4,486,684
    PTL 2: U.S. Pat. No. 4,482,838
    PTL 3: WO2010/123007
Non Patent Literature
    NPL 1: Surface Science, vol. 146, p. 583-599, 1984, A determination of the low work function planes of LaB6, Gesley, M. et al.

NPL 2: Surface Science Letters, vol., 124, p. L25-L30, 1983, An atom-probe analysis of LaB6 (001) plane, Murakami, K. et al.

NPL 3: http://jstshingi.jp/abst/p/10/1036/jst2.pdf

The invention claimed is:

1. A metal hexaboride cold field emitter comprising a metal hexaboride nanorod ending at a tip having a hydrogen-stabilized metal-terminated (100) plane.

2. The metal hexaboride cold field emitter according to claim 1, wherein the nanorod is a monocrystal that extends in a <100> direction.

3. The metal hexaboride cold field emitter according to claim 1, wherein the tip is shaped into a hemispherical form.

4. The metal hexaboride cold field emitter according to claim 1, wherein the nanorod has a diameter in a range of 10 to 300 nm.

5. The metal hexaboride cold field emitter according to claim 1, wherein the metal hexaboride is $LaB_6$.

6. An electron gun that comprises the metal hexaboride cold field emitter of claim 1.

7. The electron gun according to claim 6, wherein the electron gun comprises:
   a cooling device connected to the metal hexaboride cold field emitter via an electrically insulating heat conductor; and
   a hydrogen nozzle through which hydrogen is introduced.

* * * * *